United States Patent
Yuri

(10) Patent No.: US 7,115,435 B2
(45) Date of Patent: Oct. 3, 2006

(54) MANUFACTURING METHOD FOR WIRING SUBSTRATES

(75) Inventor: Shinji Yuri, Kasugai (JP)

(73) Assignee: NGK Spark Plug Co., Ltd., Aichi (JP)

( * ) Notice: Subject to any disclaimer, the term of this patent is extended or adjusted under 35 U.S.C. 154(b) by 40 days.

(21) Appl. No.: 11/045,130

(22) Filed: Jan. 31, 2005

(65) Prior Publication Data

US 2005/0170631 A1 Aug. 4, 2005

(30) Foreign Application Priority Data

Jan. 30, 2004 (JP) ............................. 2004-023998
Jan. 12, 2005 (JP) ............................. 2005-005510

(51) Int. Cl.
*H01L 21/00* (2006.01)
(52) U.S. Cl. ..................... 438/42; 438/57; 438/308; 438/535
(58) Field of Classification Search ................. 438/42, 438/25, 26, 30, 60, 64, 57, 75, 609, 308, 438/535
See application file for complete search history.

(56) References Cited

U.S. PATENT DOCUMENTS 5,136,152 A * 8/1992 Lee ............................. 257/699
6,853,042 B1 * 2/2005 Yoshida et al. ............. 257/432
2001/0046200 A1 * 11/2001 Saeki ..................... 369/112.07

FOREIGN PATENT DOCUMENTS

JP 2001-217546 8/2001
JP 2001-251051 9/2001

* cited by examiner

*Primary Examiner*—David Nhu
(74) *Attorney, Agent, or Firm*—Stites & Harbison PLLC; Ross F. Hunt, Jr.

(57) ABSTRACT

A manufacturing method for wiring substrates for photographing a positioning mark formed with a high precision using reflected light and executing a relative positioning operation between a wiring substrate workpiece and an exposure mask based thereon. The method steps include successively laminating a conductor layer and dielectric layer on a plate-like core and forming a positioning mark by irradiating the main surface of dielectric layer with laser light. By irradiating the positioning mark with position detecting light from the side of the main surface of the dielectric layer and detecting reflected light, relative positioning between the wiring substrate workpiece and the exposure mask is based on the detection result.

6 Claims, 7 Drawing Sheets unit (μm)

unit (μm)

MANUFACTURING METHOD FOR WIRING SUBSTRATES

BACKGROUND OF THE INVENTION

1. Field of the Invention

The present invention relates to a method for manufacturing a wiring substrate.

2. Description of Related Art

In providing a multi-layer wiring substrate for connecting such chips such as IC and LSI chips, there has conventionally been used an organic wiring substrate having a construction including a dielectric layer comprised of a polymer material and an alternately laminated conductor layer. In recent years, the mainstream approach involves so-called "built-up" wiring substrates, in which the dielectric layers and conductor layers are laminated successively, one by one, while the electric connection between these layers is provided through a via hole drilled or bored by a laser processing method or photo-processing method.

Characteristically, in the manufacturing method for built-up wiring substrates, the via formation step uses laser processing and the conductor layer formation step employs pattern plating. In the conductor layer formation step, after the plating resist is patterned using photolithography technology, an electrolytic plating process is executed. When the plating resist is patterned, providing relative positioning accuracy between an exposure mask and a wiring substrate workpiece is an important key to producing accelerated, high precision wiring. Conventionally, the relative positioning between the exposure mask and the wiring substrate workpiece has been carried out based on the result of a picture taken of a positioning mark formed on the conductor layer with transmitted light. See, e.g., Japanese Patent Application Laid-Open No. 2001-217546.

In another approach, to improve the accuracy of relative positioning between the exposure mask and wiring substrate workpiece, an attempt has been made to provide photographing of the positioning mark using reflected light. According to the photographing method using transmitted light, a positioning mark formed on the conductor layer, which is the lower layer of the laminated layers, is photographed beneath resin dielectric layer in which filler is mixed.

According to the photographing method using reflected light, the positioning mark is formed by excavating the resin dielectric layer to expose the conductor layer and the mark is read using reflected light. Because filler such as silica is usually mixed in the resin dielectric layer, it is difficult to increase the transmission ratio of the light. Therefore, the reflection method can be expected to provide improved detection accuracy in detecting the positioning mark as compared with the transmission method. Further, improvement in the positioning accuracy of the exposure mask with respect to the wiring substrate workpiece can also be expected. However, because the positioning mark used in the reflection method is formed by excavating the resin dielectric layer using laser processing at the same time that the via conductor for the interlayer connection is formed, the process for producing the positioning mark itself has a processing accuracy determined by the laser processing operation. In order to improve exposure accuracy in reading the positioning mark using the reflection method, it is important to improve the accuracy of formation of the positioning mark.

SUMMARY OF THE INVENTION

In view of the above-described problem, an object of the present invention is to provide a method for manufacturing wiring substrate in which the exposure step (and the like) is carried out by photographing a positioning mark formed with high precision, using reflected light, and in which identifying the position of the wiring substrate workpiece is based on the results of the photographing step.

To solve the above-described problem, there is provided, according to the present invention, a method for manufacturing wiring substrate including a wiring integrated portion in which a resin dielectric layer and conductor layer are alternately laminated, the manufacturing method comprising steps of: laminating the conductor layer and the resin dielectric layer on a supporting substrate with the dielectric layer outermost; forming a positioning mark, using an irradiating laser, on a main surface of the resin dielectric layer; and irradiating the positioning mark with light from the main surface side of the resin dielectric layer and detecting light reflected from said main surface and identifying the position of a wiring substrate workpiece based on the detecting step, wherein, in the step of forming the positioning mark, the laser is projected onto a selected excavation area by shifting the laser irradiation in position so as to provide overlapping of the laser irradiation in a circumferential direction and a radial direction so as to produce a ring-like excavation area forming the positioning mark, with the positioning mark comprising a groove produced by removing an annular portion of the resin dielectric layer so as to expose the conductor layer within the groove. The term "main surface" as used herein refers to a surface having the largest area.

According to this embodiment of the present invention, by "reading out" or detecting the positioning mark formed on the wiring substrate workpiece by detecting reflected light, the position of the wiring substrate workpiece can be identified. The positioning mark, which, as noted above, is formed by removing an annular or ring-like portion of the resin dielectric layer, is formed by irradiating laser during incremental shifting of the position of the irradiation. Although any inaccuracy associated with the laser device will affect the accuracy of each irradiation position, the resultant disparity will be basically averaged out over the entire irradiation positioning process. Further, because the laser irradiation is controlled so as to provide overlapping in a circumferential direction and a radial direction of the annular excavation area, smooth angular opening ends (i.e., the edges defining the annular groove of the positioning mark) can be formed on both the inside and outside opening ends of the positioning mark. For this reason, an improvement is provided in the detection accuracy in detecting the positioning mark with reflected light so that the identification accuracy of the position of the wiring substrate workpiece also is improved. Consequently, the method of this embodiment of the present invention enables further miniaturization of the wiring pattern of the wiring substrate as compared with conventional methods.

In accordance with a further aspect of the invention, a method for identifying the position of the wiring substrate workpiece is carried out as part of the exposure process. After the positioning mark is formed by removing a portion of the resin dielectric layer with a laser, a resist can be formed on the resin dielectric layer. The resist can comprise a plating resist for forming wiring of a predetermined pattern according to a plating method, an etching resist for chemical-etching a metallic film formed on the resin dielectric layer or a solder resist. The resist is preferably provided with a predetermined pattern by forming an organic photo-sensitive resin film, exposing the film so formed, and then developing the film. The exposure step may be executed in various different ways. One method is to use an exposure mask. According to this method, to provide relative positioning between the wiring substrate workpiece and the exposure mask, the positioning mark formed on a wiring substrate workpiece is used. An alternative method uses laser direct imaging (LDI) technology. More details with respect to LDI technology are provided in the description of the preferred embodiments found below and, in general, LDI technology provides exposing the resist film by direct scanning with a laser. LDI technology requires a reference position for the laser scanning and, in accordance with a further aspect of the invention, the positioning mark is used as the reference position for this scanning.

In a preferred embodiment, in the step of forming the positioning mark, inner and outer circumferential reference lines are determined in the selected excavation area, laser irradiation positions are set up at predetermined angular intervals on each of the reference lines and the laser irradiation is successively projected onto the set irradiation positions. The ring-like shape of the groove varies depending on the size and groove width. If the laser beam is controlled based on the reference lines, a balance can be achieved between high processing efficiency and success in obtaining a sharp contour opening edge.

Preferably, after the step of forming the positioning mark is executed, the method further comprises washing the positioning mark with a chemical solution for etching the metal constituting the conductor layer; forming an electroless plating layer on the surfaces of the positioning mark and the resin dielectric layer; and laminating a dry film resist for electrolytic plating layer formation on the electroless plating layer.

Advantageously, in the step of forming the positioning mark, the dry film resist is prevented from entering into the groove so as to maintain a uniform groove contour. In a preferred implementation, in the step for identifying the position of the wiring substrate workpiece, a camera for detecting reflected light is focused on the main surface of the resin dielectric layer so as to recognize opening ends of the groove of the positioning mark beneath the dry film resist. The dry film resist, used as a plating resist, is preferably prevented from entering into the groove by stretching the dry resist so as to avoid deflection thereof. Consequently, the recognition accuracy in recognizing the opening end of the groove constituting the positioning mark using reflected light is increased. Because this recognition accuracy is increased, the accuracy with which the position of the wiring substrate workpiece is identified is also improved. Moreover, although the positioning mark may be photographed through the dry resist film, the dry film resist is preferably disposed so as not to cover the positioning mark so that the positioning mark can be photographed directly.

In one embodiment, the resist is a liquid type resist which is applied directly to a wiring substrate workpiece, as well as a dry resist film having autonomy. When a liquid type resist is applied to the entire surface of the wiring substrate work, the situation is different from the case of the dry film resist because the liquid type resist will enter the groove constituting the positioning mark so that the groove is uniformly filled with the liquid type resist. If the dry film resist enters into the groove in a random or nonuniform manner, the reflection of the impinging light will be disturbed, and, as a consequence, the recognition accuracy, i.e., the accuracy with which the positioning mark is recognized, decreases. In contrast, because the liquid type resist uniformly fills the groove the reflection of the light is only minimally disturbed. Thus, the recognition accuracy of the positioning mark is excellent. However, because it is desirable that even the liquid type resist not enter into the groove if possible, it is preferable to apply the liquid type resist to the wiring substrate workpiece in such a way that the positioning mark is avoided, similarly to the case of the dry film resist.

According to another aspect of the present invention, in order to solve the basic above-described problem, there is provided a method for manufacturing a wiring substrate including a wiring integrated portion in which a resin dielectric layer and a conductor layer are alternately laminated, the manufacturing method comprising steps of: laminating the conductor layer and the resin dielectric layer on a supporting substrate with the dielectric layer outermost; forming a positioning mark by removing a portion of the resin dielectric layer to form a groove; and irradiating the positioning mark with position detecting light projected onto the main surface of the resin dielectric layer so that light is reflected therefrom; and detecting reflected light and identifying the position of a wiring substrate workpiece based on the reflected light detected, wherein, in the step of identifying the position of the wiring substrate workpiece, a camera for detecting the reflected light is focused on the main surface of the resin dielectric layer so as to recognize ends defining the groove of the positioning mark. According to this aspect of the present invention, the recognition property of the positioning mark is improved so that the identification accuracy of the position of the wiring substrate workpiece is also improved.

Further features and advantages of the present invention will be set forth in, or apparent from, the detailed description of preferred embodiments thereof which follows.

DETAILED DESCRIPTION OF THE PREFERRED EMBODIMENTS

Hereinafter, the preferred embodiments of the present invention will be described with reference to the accompanying drawings.

Figure 1:
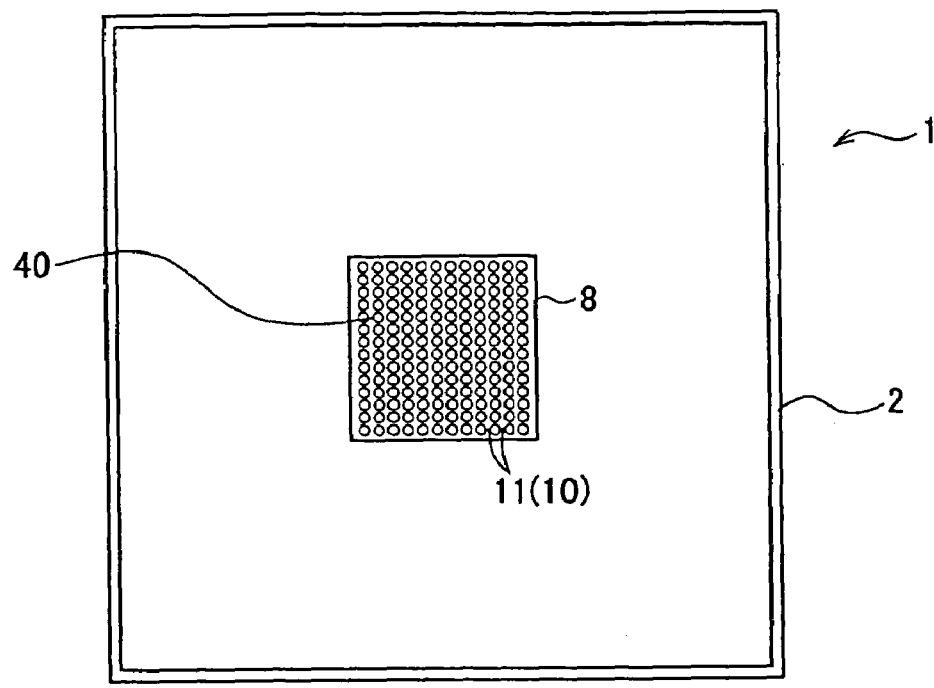
FIG. 1 is a top plan view showing an embodiment of a wiring substrate.
Figure 2:
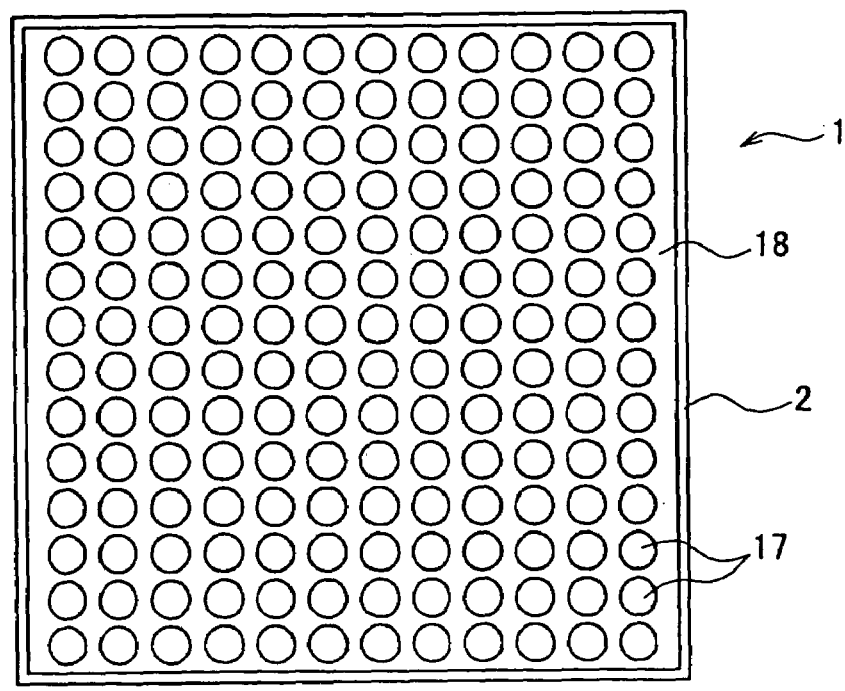
FIG. 2 is a bottom plan view of the embodiment of the wiring board shown in FIG. 1.
Figure 3:
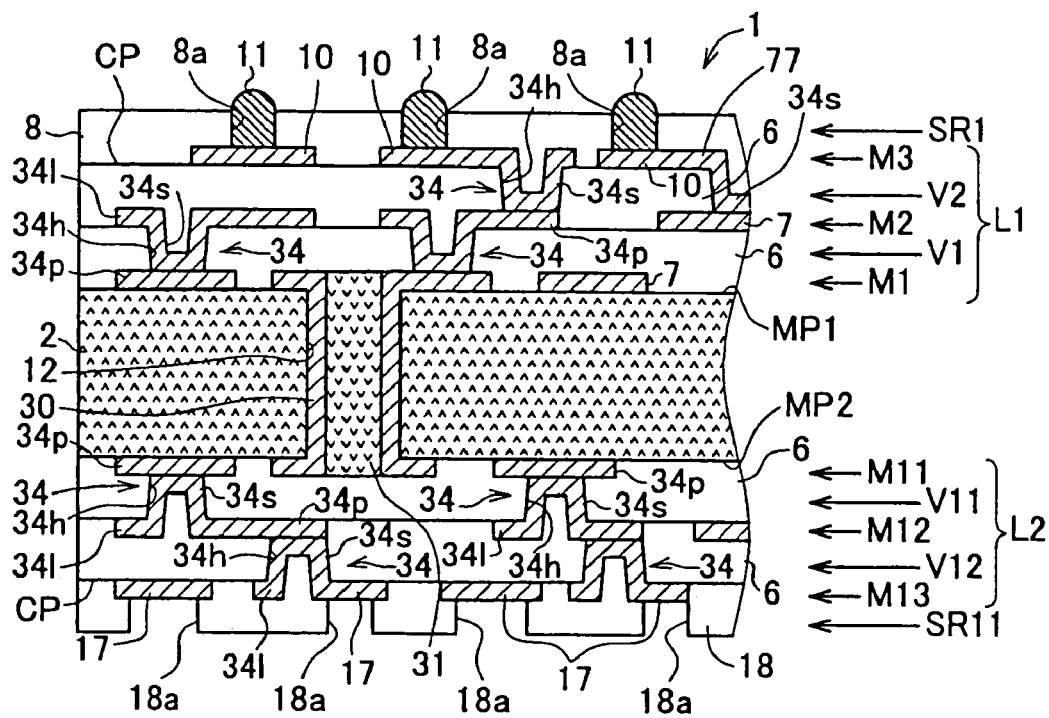
FIG. 3 is a cross sectional view showing an exemplary cross-section of the construction of the wiring board of FIGS. 1 and 2.

Referring to FIGS. 1, 2 and 3, FIG. 3 is a schematic cross sectional structure of a wiring substrate 1 according to an embodiment of the present invention. In the wiring substrate, core conductor layers M1, M11 (or simply conductor layers), which constitute wiring metallic layer in a predetermined pattern, are formed on both surfaces of a plate-like core 2 comprised of heat resistant resin plate (for example, bismaleimide-triazine resin) or fiber reinforced resin plate (for example, glass fiber reinforced epoxy resin) or the like. Core 2 includes all conductor layers M1, M11 formed as facial conductor pattern covering most of the surface of the plate-like core 2 and used as power supply layer or ground layer. A through hole 12 is formed in the plate-like core 2 by boring with a drill or the like, and a through hole conductor 30, which provides a conductive connection between the core conductor layers M1, M11, is formed on the inside wall face. Additionally, the through hole 12 is filled with a resin-based hole filling material 31 such as epoxy resin or the like.

First via layers (also referred to as built-up layers or dielectric layers) V1, V11 are formed of thermosetting resin compound 6 on the core conductor layers M1, M11. First conductor layers M2, M12 each include metallic wiring 7 formed on the surfaces thereof by plating. An interlayer connection is provided between the core conductor layers M1, M11 and the first conductor layers M2, M12 by means of a via 34.

Second via layers (also referred to as built-up layers or dielectric layers) V2, V12 are formed of thermosetting resin compound 6 on the first conductor layers M2, M12. Second conductor layers M3, M13 include metallic terminal pads 10, 17 formed on the surfaces thereof. An interlayer connection is provided between the first conductor layers M2, M12 and the second conductor layers M3, M13 by means of a via 34. The via 34 comprises a via hole 34h, a via conductor 34s provided on the inner peripheral face thereof, a via pad 34p conductively connected to the via conductors 34s, and a via land 34l which is provided on an opposite side of the via pad 34p and which projects outwardly from a peripheral edge of an opening of the via conductor 34h.

The core conductor layer M1, the first via layer V1, the first conductor layer M2 and the second via layer V2 constitute a first wiring layer portion L1 on the first main surface MP1 of the plate-like core 2. Similarly, the core conductor layer M11, the first via layer V11, the first conductor layer M12 and the second via layer V12 constitute a second wiring layer portion L2 on the second main surface MP2 of the plate-like core 2. In each case, the dielectric layer and conductor layer are alternately laminated, so that a first main surface CP is formed on the dielectric layer 6 and a plurality of metallic terminal pads 10, 17 are formed on the first main surface CP. The metallic terminal pad 10 on the side of the first wiring layer portion L1 constitutes a solder land, which is a pad (e.g., a FC pad) for "flip chip" connection to an integrated circuit chip. The metallic terminal pad 17 on the side of the second wiring layer portion L2 is used as a rear face land (e.g., a PGA pad or BGA pad) for connecting the wiring substrate itself to a mother board, or the like, having pin grid array (PGA) or ball grid array (BGA).

As shown in FIG. 1, the solder lands 10 are arranged in the form of a grid located substantially in the central portion of the first main surface of the wiring substrate 1, and constitute a chip loading portion 40 together with the solder bumps 11 (see FIG. 3) formed on each thereof.

As shown in FIG. 2, rear face lands 17 within the second conductor layer M13 (see FIG. 3) are arranged in the form of a grid. Thereafter, solder resist layers 8, 18 (SR1, SR11) comprised of a photo-sensitive or thermosetting resin compound are formed on the respective second conductor layers M3, M13. Opening portions 8a, 18a (see FIG. 3) are formed corresponding to each land 10 or 17, in one to one relation, in order to expose the solder lands 10 or the rear face lands 17, respectively. The solder bump 11 in the solder resist layer 8 formed on one side of the first wiring layer portion L1 can be comprised of solder containing substantially no Pb, such as Sn—Ag, Sn—Cu, Sn—Ag—Cu, Sn—Sb. On the other hand, the metallic terminal pad 17 on one side of the second wiring layer portion L2 is exposed within the opening 18a in the solder resist layer.

Hereinafter, the manufacturing process for the wiring substrate 1 will be described.

First, the through hole 12 is bored in a heat resistant resin plate (for example, a bismaleimide-triazine resin plate) or a fiber reinforced resin plate (for example, a glass fiber reinforced epoxy resin plate) by drilling or the like. The first conductors M1, M11 and the through hole conductor 30 are formed by pattern plating and the through hole 12 is filled with the resin hole filling material 31.

Next, after the first conductor layers M1, M11 undergo a roughening process, the resin films are bonded together into a laminate so as to cover the first conductor layers M1, M11, and hardened so as to obtain the dielectric layers V1, V11. The resin film is obtained by forming a thermosetting resin compound in which a silica filler or the like is mixed into film. After the first conductor layers M1, M11 and the dielectric layers V1, V11 are formed, in this order, on the plate-like core 2, a laser beam is directed onto the dielectric layers V1, V11 (via layer) from the main surface side so as to form the via hole 34h, according to a predetermined pattern (using a so-called "laser via" process). In the laser processing process for boring the via hole 34h, a positioning mark 50 (see FIG. 4) used in forming the conductor layers M2, M12 on the first layer is formed.

Figure 4:
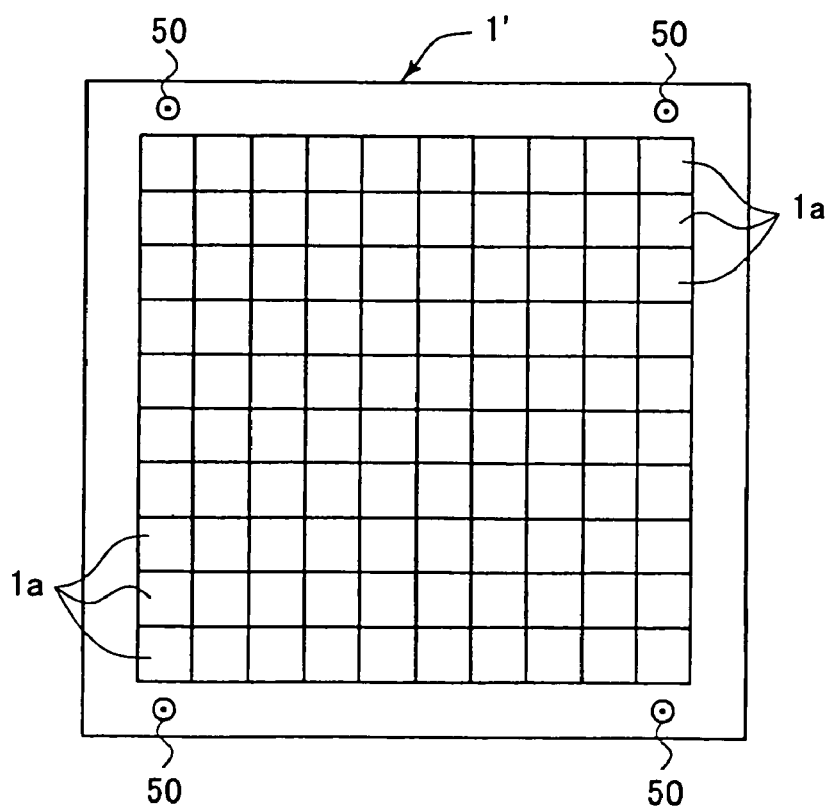
FIG. 4 is a schematic plan view of a wiring substrate workpiece.

Generally speaking, the wiring substrate 1 shown in FIG. 3 is manufactured as a concatenated wiring substrate in which plural wiring substrates 1 are concatenated as shown in FIG. 3. In other words, as shown in FIG. 4, respective processes described in connection with this embodiment are executed on a wiring substrate workpiece 1' in which a plurality of wiring substrates 1a are concatenated during manufacturing. Thereafter, a plurality of ring-like (or donut-like) positioning marks 50 are provided at the non-product portion or mounting area of the wiring substrate workpiece 1'. In this embodiment, one of the marks 50 is provided at each of the four corners of the wiring substrate workpiece 1'. Relative positioning of the wiring substrate workpiece 1' and the exposure mask can be carried out with reference to one or more of the positioning marks 50. Of course, if the wiring substrates are manufactured individually one by one, it is permissible to individually provide one or more positioning marks 50 on each of the wiring substrates.

Figure 5:
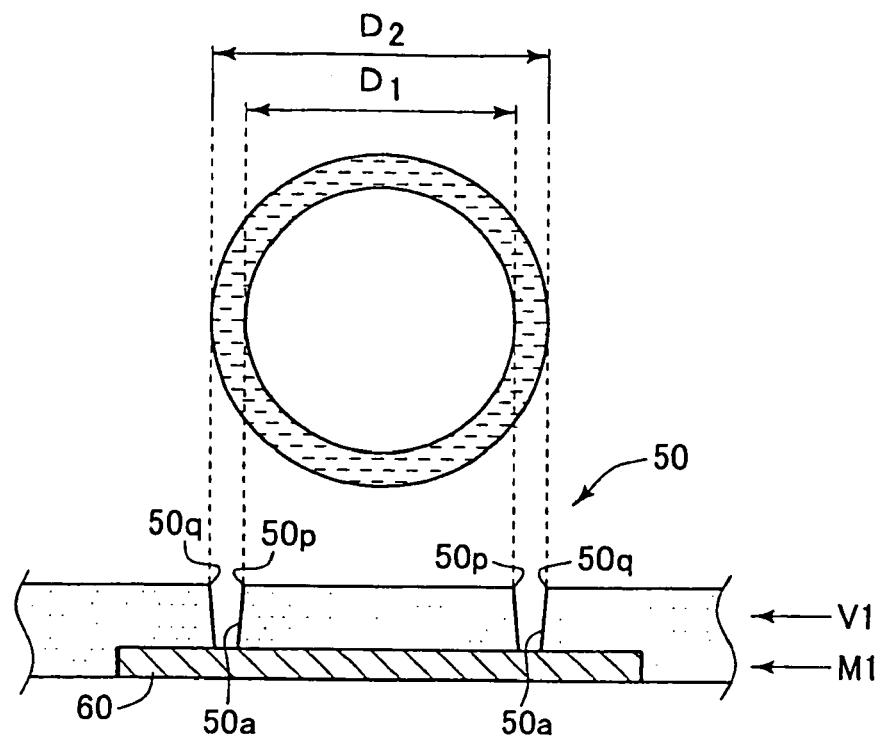
FIG. 5 is a schematic cross sectional view of a positioning mark including a top plan view of a portion thereof.

FIG. 5 shows a schematic cross sectional view of the positioning mark 50. The positioning mark 50 includes a groove 50a produced by excavating or otherwise removing a portion of the dielectric layer V1 having a ring-like or annular shape. Within the groove 50a, a foundation conductor 60, which constitutes part of the conductor layer M1, is exposed. The difference between the inside diameter D1 and the outside diameter D2 of the groove 50a which constitutes the positioning mark 50, is preferably between 20 um and 100 μm. In this regard, if the width of the groove 50a is too small, the recognition property of the groove 50a, i.e., the ability of the detection process to detect the groove 50a, decreases, thereby producing a drop in the recognition accuracy with respect to the positioning mark 50. Conversely, if the width of the groove 50a is too large, as described below, in a process for patterning a dry film resist as the plating resist (described below in connection with FIG. 7), the dry film resist is distorted and portions thereof enter into the groove 50a, so that the recognition accuracy with respect to the positioning mark 50 also decreases.

Figure 6:
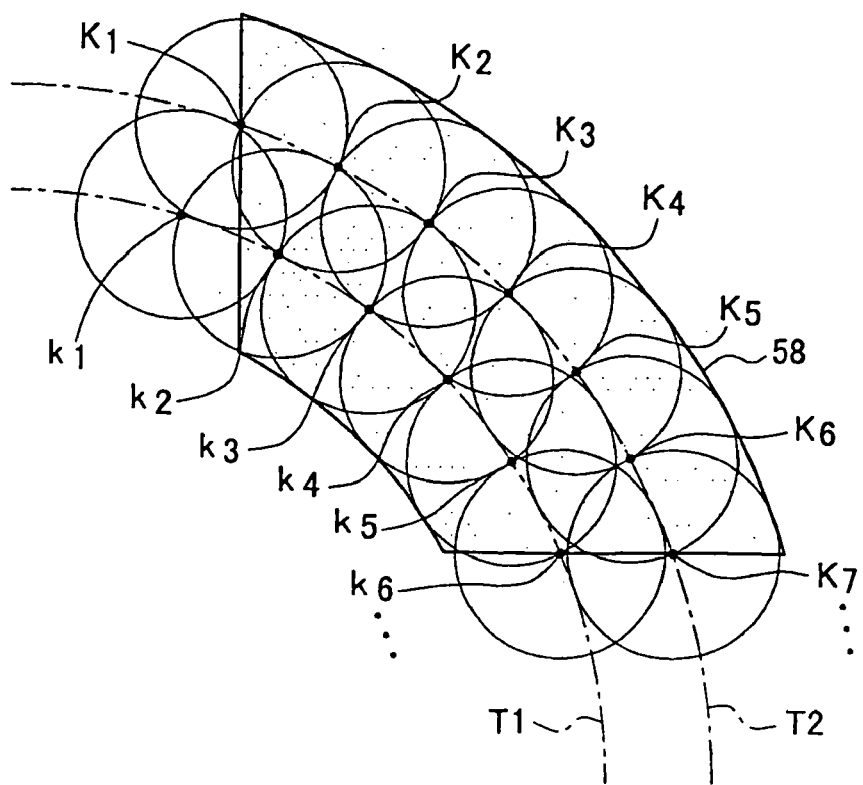
FIG. 6 is a schematic diagram showing a selected boring or excavation area including a series of laser irradiation positions.

The above-described positioning mark 50 can be formed as follows. Referring to FIG. 6, there is shown an expected (selected) excavation area 58 which is to be irradiated with a laser, and irradiation positions Km, kn (wherein m, n are each a natural number). As shown in FIG. 6, in the process for forming the positioning mark 50, the laser is projected to the expected excavation area 58 by shifting the irradiation position along a circumferential path. More specifically, two lines, referred to as inside and outside of reference lines (reference circles) T1, T2 are set up along the circumference of the expected excavation area 58, the laser irradiation positions Km, kn are set up at predetermined angular intervals on each of the reference lines T1, T2, and the laser is successively projected onto the set irradiation positions Km, kn. As a result, a plurality of laser irradiation spots are produced which overlap in the circumferential direction and the radial direction with respect to the ring-like expected excavation area 58.

By irradiating with laser as described above, the resultant opening edges 50p, 50q (see FIG. 5) of the formed groove 50a have a smooth contour with little disparity therein and the circularity of the groove contour is increased. When such a contour is obtained, this results in an improvement in the image recognition accuracy of an image pickup device (e.g., a CCD camera or the like) of an exposure device. In particular, if the relative positioning between the wiring substrate workpiece 1' and the exposure mask is carried out by image processing providing matching of (1) an image obtained by photographing (imaging) the positioning mark 50 with reflected light and (2) a preliminarily registered artificial model in terms of pattern (i.e., a patterned reference), this will positively influence that the clarity and circularity of the contour of the positioning mark 50 exerts upon the image recognition accuracy. Thus, adoption of a laser processing operation in accordance with this embodiment is preferred Further, it is preferable to obtain multiple position information pieces by photographing a plurality of positioning marks 50 according to the reflection method, and then carry out relative positioning between the wiring substrate workpiece 1' and the exposure mask based on position information obtained by averaging these multiple position information pieces.

In the boring operation provided during laser processing, two-pulse irradiation by the laser on the same position is often carried out. However, cyclic processing, in which scanning of the same order is repeated, has been found to produce less heat locally than the two-pulse irradiation of the same position, so that processing accuracy is increased using cyclic processing. If the reference lines T1, T2 are determined as shown in FIG. 6, the laser is preferably projected successively onto the irradiation positions Km set at predetermined intervals along the reference line T1 and thereafter, the laser is projected successively onto the irradiation positions kn set at predetermined intervals along the reference line T2. Preferably, these scanning operations are repeated twice.

In the laser processing used in forming the positioning marks 50 and the via holes 34h, various types of conventional lasers can be used, such as a excimer laser, a carbon dioxide gas laser, and a Nd:YAG laser. When the positioning mark 50 is formed, the spot diameter produced by the laser beam is adjusted based on the irradiation positions Km, kn, the area of the expected excavation area 58 and the like. For example, in the case of FIG. 6, the spot diameter of the laser beam on the main surface of the dielectric layer V1 is preferably adjusted to be about ⅔ of the width of the groove 50 of the positioning mark 50 in the radial direction. In the example shown in FIG. 6, the outer edge of an irradiation spot projected onto an irradiation position passes the irradiation position (i.e., the center of beam) adjacent thereto, as illustrated. In this case, it is preferable that the overlapping ratio, i.e., the amount of overlapping of the irradiation spots at paired irradiation positions adjacent to each other is about 40%.

After the positioning mark 50 is formed by the laser processing described above, the interior of the groove 50a, and that of the via hole 34h, are rinsed using a chromic acid solution or an alkaline potassium permanganate solution or the like (in a "de-smear" process). Consequently, any "smear" or excess left in the via hole 34h and the groove 50a is removed. After the de-smear process is terminated, the surface portion of the foundation conductor 60 exposed within the groove 50a of the positioning mark 50 and the surface portion of the via pad 34p exposed in the via hole 34h are removed. The conductor layer M1 then undergoes a roughening processing for improving the adhesion of the dielectric layer V1. If the roughening layer which constitutes the surface portion of the conductor layer M1 is preliminarily removed, the plating deposition performance of the electroless Cu plating operation is improved, thereby contributing to conductive connectivity of the via. For this "soft etching," sulfuric acid or hydrochloric acid can, for example, be used. It is permissible to adopt a method of micro-etching of the Cu which forms the conductor layer M1 with an oxidized solution such as $H_2SO_4$—$H_2O_2$ or $Na_2S_2O_8$, and then wash with sulfuric acid or hydrochloric acid.

Figure 7:
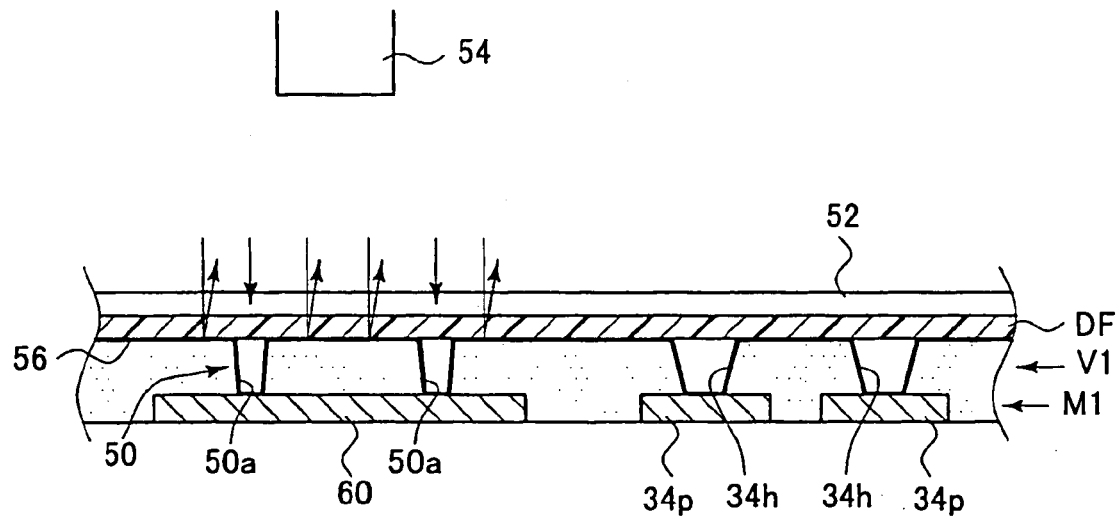
FIG. 7 is a schematic cross sectional view illustrating a process in which a positioning mark is photographed with reflected light and relative positioning between a wiring substrate workpiece and an exposure mask is carried out.

Referring to FIG. 6, in the next step, the electroless Cu plating layer 56 is formed on the surface of the dielectric layer V1. Then, as shown in FIG. 7, a dry film resist DF used in electrolytic plating layer formation is laminated onto the electroless Cu plating layer 56. This dry film resist DF is patterned through exposure and development, and is used as a plating resist for electrolytic Cu plating. One process for exposing the dry film resist DF is carried out as follows. By irradiating the positioning mark 50 with light for position detection from the main surface side of the dielectric layer V1, reflected light is detected by an image pickup device such a CCD camera 54. The surface of the dielectric layer V1 is roughened with chemical solution e.g., alkaline potassium permanganate solution or the like) used in the above-described de-smear process. Because the reflection factor of the groove 50a of the positioning mark 50 is higher than that of the portion surrounding the groove 50, the positioning mark 50 can be recognized with a high accuracy.

The relative positioning between the wiring substrate workpiece 1' and the exposure mask, denoted 52 in FIG. 7, is carried out based on position information obtained by photographing the positioning mark 50 with the CCD camera 54 and processing the resultant image. Here, the CCD camera 54 for detecting reflected light can be focused on the main surface of the dielectric layer V1. Then, photographing the positioning mark 50 beneath the dry film resist DF enables recognition of the opening edges 50p, 50q (see FIG. 5) of the groove 50a.

At this time, the dry film resist DF is preferably stretched over the groove 50a so that dry film resist DF does not droop into or otherwise occupy part of groove 50a. If the dry film resist DF extends into the groove 50a, recognition accuracy, i.e., the accuracy with which the edges of the positioning mark 50 (i.e., opening ends 50p, 50q of the groove 50a) is recognized, decreases. Therefore, in the process for forming the positioning mark 50, the expected excavation area 58 (the width of the groove 50a) is provided in a way that prevents the dry film resist DF from entering into or otherwise occupying part of the groove 50a excavated by the aser.

In the above-described way, the relative positioning between the wiring substrate workpiece 1' and the exposure mask (denoted 52 in FIG. 7) is carried out, and the dry film resist DF is exposed and developed. After that, an electrolytic Cu plating process is executed. The electrolytic Cu plating layer is formed selectively at portions not covered with the dry film resist DF. After the electrolytic Cu plating process is terminated, the dry film resist DF is removed with chemical solution. Then, the electroless Cu plating layer 56 used as a power supply passage for forming the electrolytic Cu plating layer is removed by rapid etching. Consequently, the conductor layer M2 having a predetermined desired pattern is formed.

Figure 10:
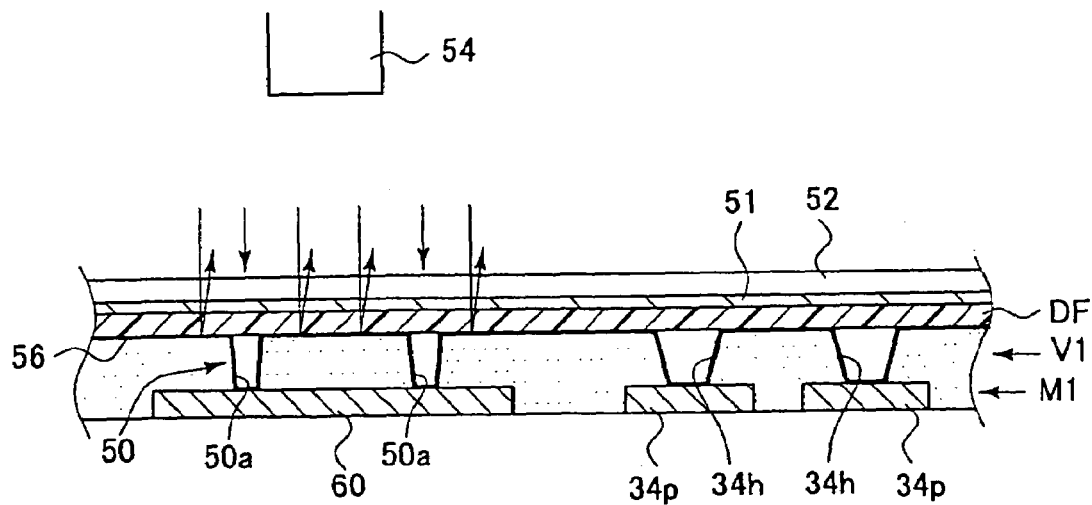
FIG. 10 is a schematic cross sectional view showing an embodiment in which the positioning process and exposure process are carried out using dry film resist supported by a PET or other supporting film.

In the embodiment shown in FIG. 10, in which the dry film resist DF is supported by a thin supporting film 51, light can be projected for use in recognizing the positioning mark 50 through the dry film resist DF, the supporting film 51 and the exposure mask 52. An exposure process can thus be carried out as shown in FIG. 10. This embodiment is generally preferable because dust and dirt are not likely to adhere to the exposure mask 52. Because according to one aspect of the present invention, the wiring substrate workpiece 1' is provided with one or more positioning marks 50 having excellent recognition properties, even if the supporting film 51 is provided between the dry film resist DF and the exposure mask 52, this does not present a serious obstacle to high positioning accuracy. The supporting film 51 preferably has good transmission properties and, more specifically, the light transmission ratio is preferably 80% or higher, with respect to the light used in photographing or imaging the positioning mark (which is, for example, white light) and the light used in exposing the dry resist film DF (e.g., an i beam, h beam, or g beam). For example, a thin PET film is preferably used.

Figure 11:
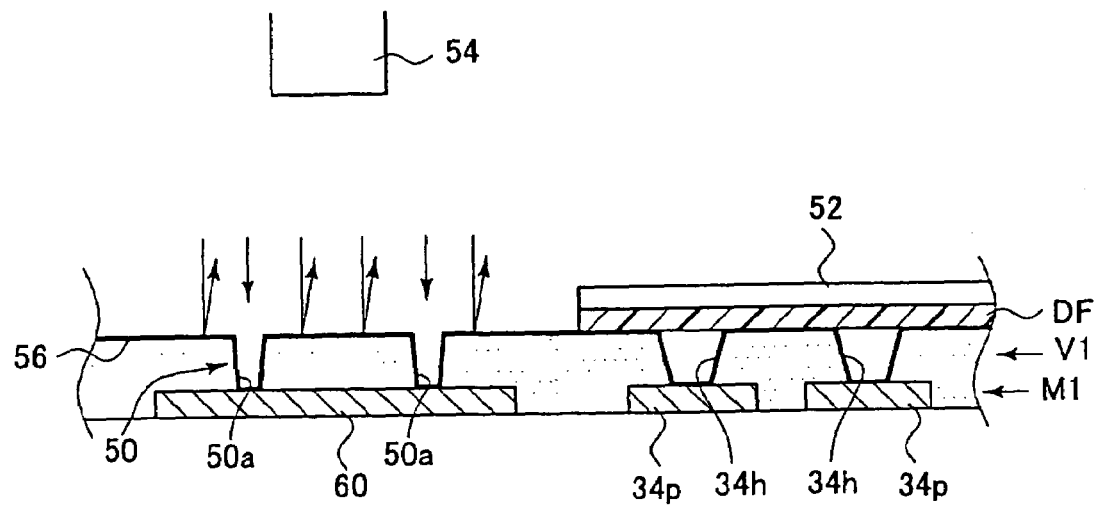
FIG. 11 is a schematic cross sectional view showing an embodiment in which the positioning mark is photographed in an area not covered by the exposure mask and dry resist film.

As shown in FIG. 11, in one preferred embodiment, the dry film resist DF is laminated on the wiring substrate workpiece 1' in an area separate from that at which positioning mark 50 is disposed, and the exposure mask 52 is also disposed so as to not overlie, or to otherwise avoid covering, the positioning mark 50. In this way, any obstacle between the positioning mark 50 and the CCD camera 54 is removed, and thus there is no reduction in contrast, so that the recognition accuracy in recognizing the positioning mark 50 is quite excellent.

Continuing on with a description of the manufacturing process, after the first wiring layer portion L1 and the second wiring layer portion L2 are formed by repeating the above-described procedure, solder resist layers SR1, SR11 are formed. Next, the openings 8a, 18a are provided in the solder resist layers SR1, SR11. Then, by plating the conductor layers M3, M13 exposed within the openings 8a, 18a in the solder resist layers SR1, SR11 with, e.g., Ni/Au, the terminal pads 10, 17 are obtained. After the Ni/Au plating process is terminated, a reflow process is carried out by filling in the opening 8a of the solder resist layer SR1 with a lead free solder paste or a Sn—Pb eutectic paste, using a screen printing method or the like. As a result, the solder bump 11 is formed on the terminal pad 10. Thus, in the above-described way, the wiring substrate 1 shown in FIG. 3.

Figure 12:
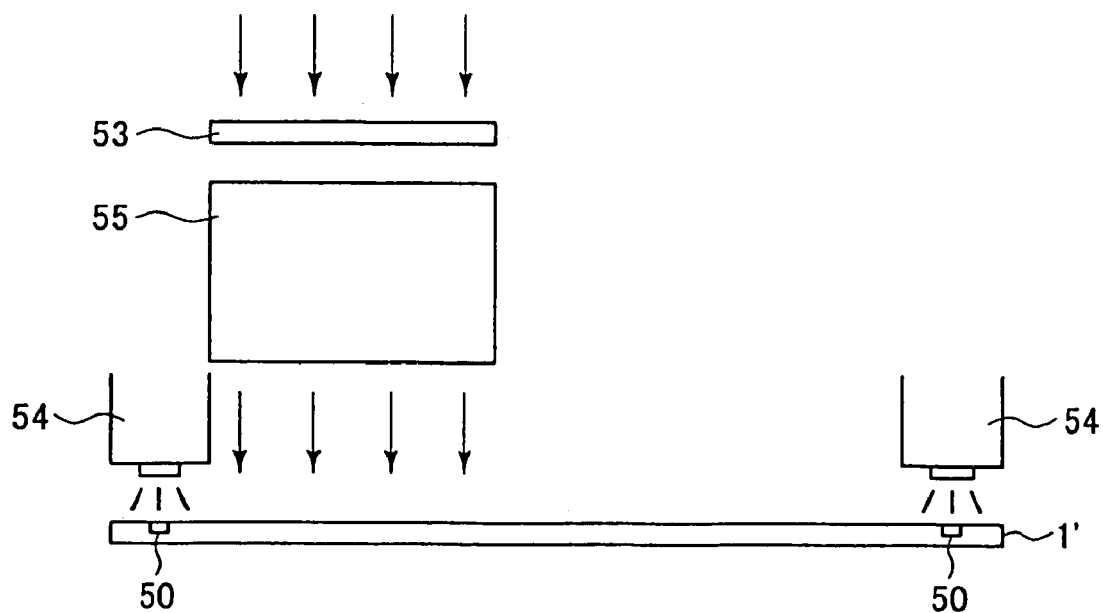
FIG. 12 is a schematic side elevational view showing an exposure process using divisional light projection.

Turning to another embodiment of exposure process, although the embodiment described above in connection with FIGS. 7, 10, and 11 is premised on an exposure method in which the exposure mask 52 is brought into contact with, or brought sufficiently close to, the wiring substrate workpiece 1', namely, the so-called "contact" exposure method, it should be understood that the present invention is not limited to the use of contact exposure. In another embodiment shown in FIG. 12, an exposure method is used in which a projection lens 55 is interposed between the wiring substrate workpiece 1' and the exposure mask 53, namely, a method referred to as "projection" exposure. Further, although FIG. 12 shows a "division" exposure method in which exposure is executed by dividing the area to be exposed into a plurality of small areas, a lump exposure method can be used in which all of the wiring substrate workpiece 1' is exposed in the unit of a panel (i.e., a frame), i.e., one in which the entire workpiece 1' is covered or lumped together in the resultant image. It is noted that there is no difference between the projection exposure method and the contact exposure method to the extent that, in both methods, the positioning mark 50 is photographed with the CCD camera 54 and the relative positioning between the wiring substrate workpiece 1' and the exposure mask 53 is carried out based on the result of the photographing step.

Figure 13:
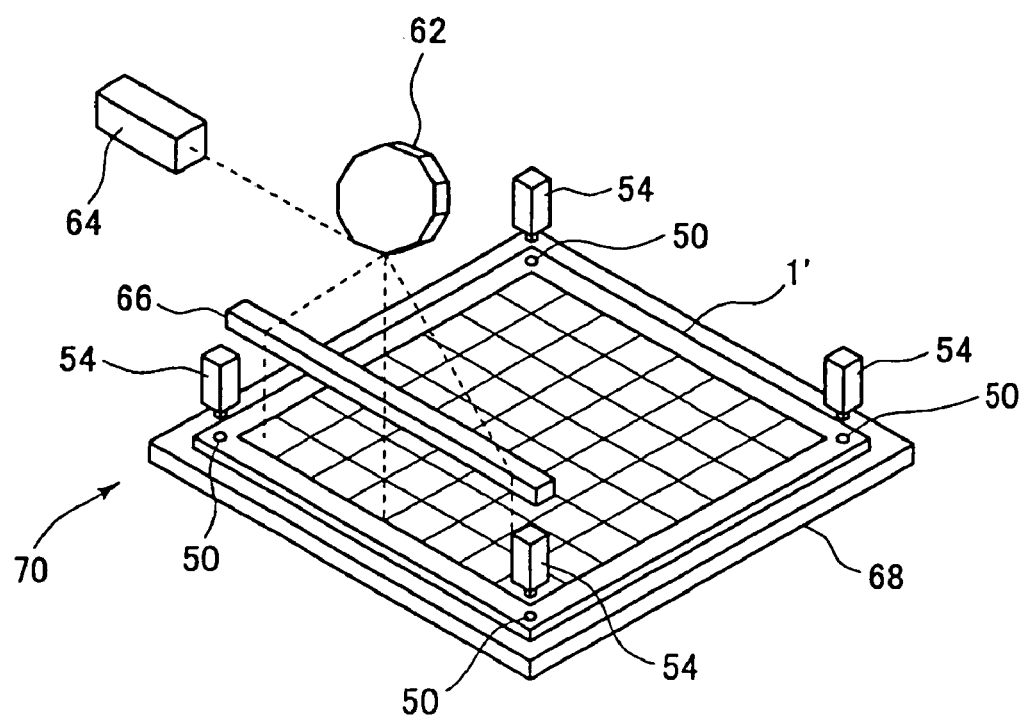
FIG. 13 is a schematic perspective view showing an exposure process based on LDI technology.

Further, an exposure method using no mask can be used in accordance with another aspect of the present invention. An example of an exposure method using no mask is the method using a LDI system 70 shown in FIG. 13. The LDI system 70 comprises a UV laser oscillator 64, a polygon mirror 62, a lens 66, a CCD camera 54 and an XY stage 68. A laser beam generated by the UV laser oscillator 64 is irradiated onto the wiring substrate workpiece 1' according to a predetermined pattern, through an optical system including the polygon mirror 62 and the lens 66. Consequently, a latent image is formed on the dry film resist on the wiring substrate workpiece 1'. The LDI system 70 photographs the positioning mark 50 with the CCD camera 54, and controls the position of the XY stage 68 based on the photograph that results, so as to adjust the relative position between the wiring substrate workpiece 1' and a coordinate system. The coordinate system uses raster data for the irradiating laser and adjustments are made based thereon, and the laser is then projected. It will be appreciated that, even if an exposure process using no mask is used, the provision of one or more positioning marks 50 having excellent recognition properties, is indispensable to the process. Further, although the embodiment of FIG. 13 is concerned with the raster scan method, a vector scanning method can also be employed.

Figure 8:
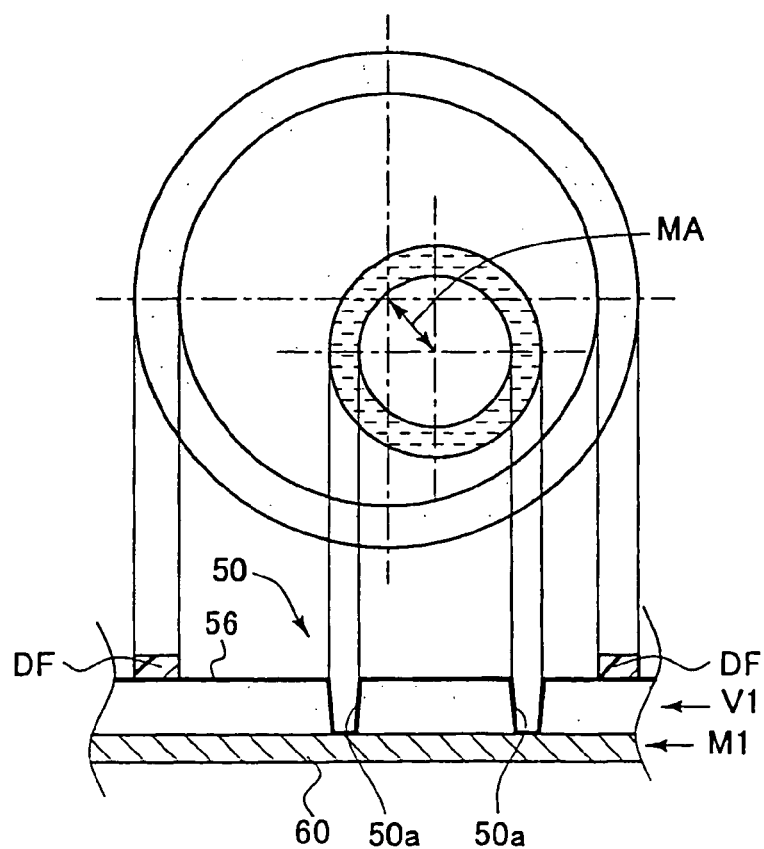
FIG. 8 is a cross sectional view including a top plan view explaining the concept of misalignment as it applies here.

Considering an experimental example, the following experiment was carried out to verify the results produced by a preferred embodiment of the present invention. First, the wiring substrate workpiece 1' having a positioning mark 50, in which the inside diameter of the groove 50a was 0.8 mm and the outside diameter was 1.0 mm, was replicated according to the procedure described above. For each wiring substrate workpiece 11, the positioning mark 50 was photographed using the above-described reflection method, and positioning of the exposure mask was executed. In the exposure mask used, as shown in FIG. 8, a pattern was so formed that the dry film resist DF was exposed and developed such that a portion thereof surrounds the positioning mark 50 coaxially. Additionally, the stage on which the wiring substrate workpiece 1' was mounted was not moved for the period between the time of photographing of the positioning mark 50 and the time at which the dry film resist DF was developed.

After the exposure/development process, for each wiring substrate workpiece 1', as shown in FIG. 8, so as to determine the amount of misalignment MA. MA is the amount of deflection between (1) the central coordinate of the dry film resist DF patterned in a ring shape, and (2) the central coordinate of the positioning mark 50. To provide a comparative example, using a wiring substrate workpiece in which a Cu land of 1.0 mm in diameter was formed in the conductor layer M1, the Cu land was photographed with transmission light transmitted from the side of the plate-like core, the dry film resist was exposed and developed using the same procedure as described above and the misalignment (misalignment amount MA) was measured.

Figure 9A:
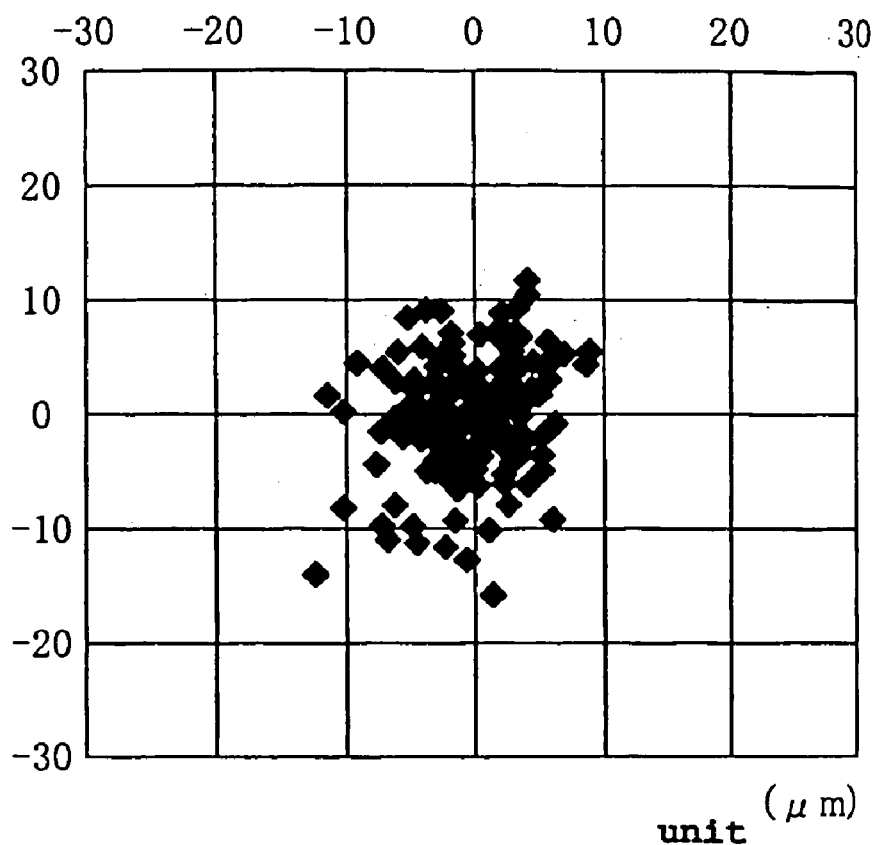
FIG. 9A and FIG. 9B are distribution diagrams showing experimental results.
Figure 9B:
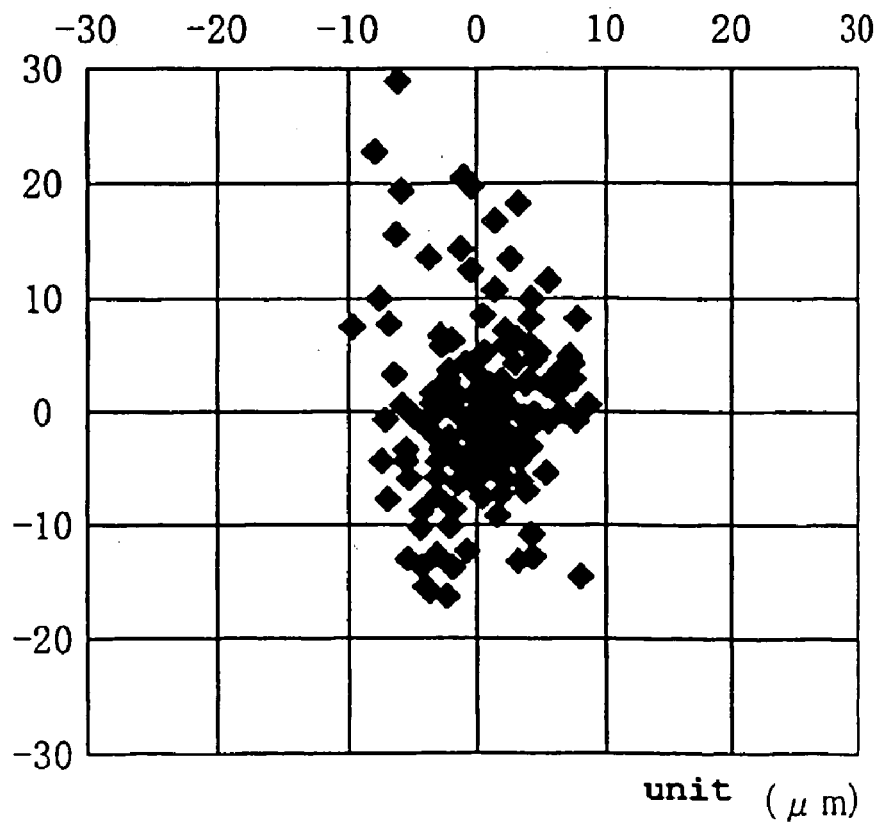

The results of the above measurements are shown in FIGS. 9A and 9B. More specifically, FIG. 9A shows the results when the ring-like positioning mark 50 is used and FIG. 9B shows the comparative results. As is evident from these results, the variation in the misalignment amount MA was smaller to using the method of developing the positioning mark 50 formed in accordance with the method of the present invention employing reflected light, as compared with the light transmission method (the comparative example). The recognition property of the positioning mark 50 was excellent, and the positioning accuracy in positioning the exposure mask and the wiring substrate workpiece was high.

Although the invention has been described above in relation to preferred embodiments thereof, it will be understood by those skilled in the art that variations and modifications can be effected in these preferred embodiments without departing from the scope and spirit of the invention.

What is claimed:

1. A method for manufacturing a wiring substrate including a wiring integrated portion in which a resin dielectric layer and a conductor layer are alternately laminated, said manufacturing method comprising steps of:

laminating said conductor layer and said resin dielectric layer on a supporting substrate with an outermost dielectric layer;

forming a positioning mark, using an irradiating laser, on a main surface of said resin dielectric layer; and irradiating said positioning mark with light from the main surface side of said resin dielectric layer and detecting light reflected from said main surface, and identifying a position of a wiring substrate workpiece based on said detecting of light reflected from said surface, wherein in the step of forming the positioning mark, said irradiating laser is projected onto a selected excavation area by shifting the laser irradiation in position so as to provide overlapping in a circumferential direction and in a radial direction to produce a ring-like excavation area forming said positioning mark, the positioning mark comprising a groove produced by removing an annular portion of said resin dielectric layer so as to expose said conductor layer within the groove.

2. The method according to claim 1 wherein in the step of forming said positioning mark, inner and outer circumferential reference lines are determined in the selected excavation area, laser irradiation positions are set up at predetermined angular intervals on each of the inner and outer circumferential reference lines, and the laser is successively projected onto the laser irradiation positions.

3. The method according to claim 1 wherein the conductor layer comprises a metal; and the method further comprises after the step of forming the positioning mark, a step of washing said positioning mark with a chemical solution for etching the metal comprising said conductor layer;

forming an electroless plating layer on surfaces of said positioning layer mark and said resin dielectric layer; and laminating a dry film resist for electrolytic plating layer formation on said electroless plating layer.

4. The method according to claim 3 wherein in the step of forming said positioning mark, the dry film resist is prevented from entering into said groove so as to maintain a uniform groove contour.

5. The method according to claim 4 wherein in the step of identifying the position of said wiring substrate workpiece, a camera for detecting reflected light is focused on the main surface of said resin dielectric layer so as to recognize opening ends of said groove of said positioning mark beneath said dry film resist.

6. A method of manufacturing a wiring substrate including a wiring integrated portion in which a resin dielectric layer and a conductor layer are alternately laminated, said method comprising the steps of:

laminating said conductor layer and said resin dielectric layer on a supporting substrate with an outermost dielectric layer, said resin layer having a main surface;

forming a positioning mark by removing a portion of said resin dielectric layer to form a groove; and irradiating said positioning mark with position detecting light projected onto the main surface of said resin dielectric layer so that light is reflected therefrom and detecting reflected light and identifying a position of a wiring substrate workpiece based on the reflected light detected, wherein, in the step of identifying the position of the wiring substrate workpiece, a camera for detecting said reflected light is focused on the main surface of said resin dielectric layer so as to recognize ends defining the groove of said positioning mark.

* * * * *